United States Patent
Mawatari

(10) Patent No.: US 10,639,890 B2
(45) Date of Patent: May 5, 2020

(54) INKJET HEAD AND METHOD OF MANUFACTURING THE SAME, AND INKJET RECORDING APPARATUS

(71) Applicant: KONICA MINOLTA, INC., Chiyoda-ku, Tokyo (JP)

(72) Inventor: Kenji Mawatari, Musashino Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/774,817

(22) PCT Filed: Oct. 26, 2016

(86) PCT No.: PCT/JP2016/081680
§ 371 (c)(1),
(2) Date: May 9, 2018

(87) PCT Pub. No.: WO2017/082049
PCT Pub. Date: May 18, 2017

(65) Prior Publication Data
US 2018/0326727 A1   Nov. 15, 2018

(30) Foreign Application Priority Data

Nov. 11, 2015   (JP) .................................. 2015-221162

(51) Int. Cl.
*B41J 2/14*    (2006.01)
*H01L 41/09*   (2006.01)
(Continued)

(52) U.S. Cl.
CPC ........... *B41J 2/14233* (2013.01); *B41J 2/161* (2013.01); *B41J 2/1628* (2013.01); *B41J 2/1631* (2013.01);
(Continued)

(58) Field of Classification Search
CPC ..... H01L 41/18; H01L 41/00; H01L 41/1875; H01L 41/1876; B41J 2/14233; B41J 2/14201; B41J 2002/14266; B41J 2202/03
See application file for complete search history.

(56) References Cited

U.S. PATENT DOCUMENTS 6,494,566 B1 * 12/2002 Kishino ............... B41J 2/14233
29/25.35
8,076,257 B1 * 12/2011 Wilson .................. C04B 35/462
361/321.4
(Continued)

FOREIGN PATENT DOCUMENTS

JP      H11123823 A    5/1999
JP      2007049025 A   2/2007
(Continued)

OTHER PUBLICATIONS

International Preliminary Report corresponding to Application No. PCT/JP2016/081680; dated May 15, 2018.
International Search Report corresponding to Application No. PCT/JP2016/081680; dated Dec. 20, 2016.
China NIPA First Office Action corresponding to Application No. 201680065821.1; dated Mar. 19, 2019.
(Continued)

*Primary Examiner* — Geoffrey S Mruk
(74) *Attorney, Agent, or Firm* — Cantor Colburn LLP

(57) ABSTRACT

An inkjet head configured to eject inkjet ink includes a piezoelectric layer of a thin film and a diaphragm. An absolute value of a product of a piezoelectric constant $d_{31}$ of the piezoelectric layer and a Young's modulus of the piezoelectric layer is 10 [C/m$^2$] to 15 [C/m$^2$]. Even when the inkjet head ejects ink having a high viscosity, variation of driving voltage during ejection can be suppressed.

11 Claims, 18 Drawing Sheets

(51) Int. Cl.
*H01L 41/187* (2006.01)
*B41J 2/16* (2006.01)
*H01L 41/08* (2006.01)

(52) U.S. Cl.
CPC ........... *B41J 2/1645* (2013.01); *B41J 2/1646* (2013.01); *H01L 41/0815* (2013.01); *H01L 41/0973* (2013.01); *H01L 41/1876* (2013.01); *B41J 2002/14266* (2013.01); *B41J 2202/03* (2013.01)

(56) References Cited

U.S. PATENT DOCUMENTS

| | | | | |
|---|---|---|---|---|
| 2009/0114875 | A1* | 5/2009 | Arakawa | C04B 35/491 252/62.9 PZ |
| 2014/0124695 | A1 | 5/2014 | Koyama et al. | |
| 2014/0339961 | A1 | 11/2014 | Maejima et al. | |
| 2015/0015121 | A1 | 1/2015 | Watanabe et al. | |
| 2015/0255703 | A1 | 9/2015 | Furuta et al. | |

FOREIGN PATENT DOCUMENTS

| | | |
|---|---|---|
| JP | 2008235597 A | 10/2008 |
| JP | 2009117592 A | 5/2009 |
| JP | 2011181556 A | 9/2011 |
| JP | 2011233817 A | 11/2011 |
| JP | 2013089660 A | 5/2013 |
| JP | 2015027789 A | 2/2015 |
| JP | 2015035587 A | 2/2015 |
| WO | 2015125520 A1 | 8/2015 |
| WO | 2016198895 A1 | 12/2016 |

OTHER PUBLICATIONS

European Office Action corresponding to Application No. 16864013.4-1019; dated Jun. 13, 2019.

Corrected European Search Report corresponding to Application No. 16864013.4-1019/3375611; dated Dec. 10, 2018.

JPO Notice of Reasons for Refusal corresponding to JP Patent Appln. No. 2017-550051 dated Nov. 19, 2020.

* cited by examiner

INKJET HEAD AND METHOD OF MANUFACTURING THE SAME, AND INKJET RECORDING APPARATUS

CROSS REFERENCE TO RELATED APPLICATION(S)

This is the U.S. national stage of application No. PCT/JP2016/081680, filed on Oct. 26, 2016. Priority under 35 U.S.C. § 119(a) and 35 U.S.C. § 365(b) is claimed from Japanese Application No. 2015-221162, filed Nov. 11, 2015, the disclosure of which is also incorporated herein by reference.

TECHNOLOGICAL FIELD

The present invention relates an inkjet head and a method of manufacturing the same, and an inkjet recording apparatus.

BACKGROUND

As disclosed in Japanese Laid-Open Patent Publication No. 2007-049025 (Patent Document 1), an inkjet recording apparatus including an inkjet head and capable of outputting a two-dimensional image is known. The inkjet head includes a plurality of channels for ejecting inkjet ink (which hereinafter may be simply referred to as "ink"). The plurality of channels eject ink while moving relative to a recording medium such as paper and cloth. The known systems for ejecting ink include a pressure system with a variety of actuators, such as piezoelectric actuator, electrostatic actuator, and actuator using thermal deformation, and a thermal system generating bubbles by heat.

Among those systems, the system including a piezoelectric actuator is advantageous in that output is large, modulation is possible, the responsiveness is high, and any ink can be used. As piezoelectric actuators, those formed of piezoelectric substances, such as lead zirconate titanate-based compounds (PZT), are known. In recent years, MEMS (Micro Electro Mechanical System) devices with silicon (Si) substrates have been increasingly employed. More specifically, MEMS techniques are applied to fabrication of piezoelectric actuators so as to form a piezoelectric substance into a thin film, and thereby, a piezoelectric actuator can be formed of a thin-film piezoelectric element.

When a piezoelectric actuator is formed of a thin-film piezoelectric element, high-precision processes using semiconductor process techniques, such as film deposition and photolithography, can be performed to achieve size reduction and higher density. A batch process can be performed on a wafer with a large area. Therefore, high production efficiency and cost reduction can also be expected. Another advantage is that conversion efficiency between mechanical energy and electrical energy is improved to provide high characteristics. It therefore can be said that thin-film piezoelectric elements are suitable for implementing high-resolution, compact, and low-cost inkjet heads.

Here, when a piezoelectric actuator is formed of a thin-film piezoelectric element, typically, an electrode is formed on a silicon (Si) or other substrate, and a piezoelectric layer of a thin film is formed on the electrode. Here, since the piezoelectric layer has a lattice constant different from that of a crystal in the electrode, a polycrystal made of a group of a plurality of crystals is formed. Depending on the production process, the polycrystal (polycrystal film) may have a granular crystal shape or a columnar crystal shape.

In the case of granular crystal, the polycrystal film forms granular crystals having a grain size of a few hundred nm. On the other hand, in the case of columnar crystal, the polycrystal film has a width of a few hundred nm and forms crystal grains that gather into a shape like a single elongated column in the film thickness direction. In the case of columnar crystal, it is known that the more crystals are grown on the crystal plane positioned at the same location in the film thickness direction (in other words, the higher is the orientation), the higher is the piezoelectric characteristics of the polycrystal film.

CITATION LIST

Patent Document

PTD 1: Japanese Laid-Open Patent Publication No. 2007-049025

SUMMARY

Technical Problem

In recent years, inkjet recording apparatuses (inkjet printers) are requested to form finer images faster. In order to achieve this, inkjet heads are requested to stably eject ink, for example, having a high viscosity, such as 10 [cp] or more. In order to enable ejection of high-viscosity ink, a piezoelectric actuator having high output characteristics is required.

As mentioned in the beginning, an inkjet head having a thin-film piezoelectric element as a piezoelectric actuator is known. However, even when a conventional inkjet head includes a piezoelectric actuator having high output characteristics, the driving voltage varies in ejection of ink having a high viscosity such as 10 [cp] or more, causing variations in ink ejection rate. Consequently, a high-quality image may fail to be formed.

Specifically, the output characteristic of a bend-type piezoelectric actuator is proportional to the product of the piezoelectric constant $d_{31}$ of the piezoelectric layer (piezoelectric material) and the Young's modulus of the piezoelectric layer. In order to improve the output characteristics of the piezoelectric actuator, it is desirable that both of the piezoelectric constant of the piezoelectric layer and the Young's modulus of the piezoelectric layer should be increased. In order to increase the piezoelectric constant of the piezoelectric layer, for example, donor ions, such as La and Nb, are added to a piezoelectric material (such as PZT).

In Japanese Laid-Open Patent Publication No. 2007-049025 (Patent Document 1), the piezoelectric constant of the piezoelectric layer is increased by adding a donor element to a piezoelectric material. Specifically, the ratio between the piezoelectric constant of the piezoelectric layer and the elastic compliance (the reciprocal of Young's modulus) of the piezoelectric layer is set to be greater than 5 $[C/m^2]$, and in addition, the elastic compliance of the diaphragm is set to be greater than $2 \times 10^{-8}$ $[m^2/N]$ (that is, the Young's modulus is set to be smaller than 50 [MPa]). According to Patent Document 1, these configurations can improve the driving efficiency.

However, in general, when the amount of donor added increases, the Young's modulus of the thin-film piezoelectric layer formed of a polycrystal film decreases. For example, in a bend-type piezoelectric actuator formed using the MEMS technique, silicon (Si) having a Young's modulus of 100 [GPa] to 200 [GPa] is often used as a material of the diaphragm. With a diaphragm having such a large Young's modulus, when the amount of donor added increases, the Young's modulus of the thin-film piezoelectric layer decreases, and the output characteristics of the piezoelectric actuator as a whole decreases. This makes it difficult to eject ink having a high viscosity.

In the case of ceramic piezoelectric elements, it is known that, in addition to donor ions, acceptor ions, such as Fe and Mn, are added together as means for improving the piezoelectric constant without reducing the Young's modulus. However, in a piezoelectric element formed of a thin-film piezoelectric layer, the addition of donor ions and/or acceptor ions increases the kinds of ions included in the film. This is likely to cause variation in film quality in the deposition process of a piezoelectric layer formed of a thin film and causes variation of the value of the piezoelectric constant and the value of the Young's modulus. This results in variation of the driving voltage during ink ejection, which is an indicator of the output characteristics in the actual inkjet head. The ink ejection rate then may vary, leading to failure to form high-quality images.

An object of the present invention is to provide an inkjet head and a method of manufacturing the same, and an inkjet recording apparatus, in which even when ink having a high viscosity, such as 10 [cp] or more, is ejected, variation of driving voltage during ink ejection is suppressed, and stable high output characteristics are achieved.

Solution to Problem

An inkjet head according to the present invention is configured to eject inkjet ink. The inkjet head includes a piezoelectric layer formed of a thin film and a diaphragm. The absolute value of the product of the piezoelectric constant $d_{31}$ of the piezoelectric layer and the Young's modulus of the piezoelectric layer is 10 $[C/m^2]$ to 15 $[C/m^2]$.

In the inkjet head above, preferably, the inkjet ink in the inkjet head has a viscosity of 15 [cp] or less.

In the inkjet head above, preferably, the diaphragm has a Young's modulus of 100 [GPa] to 500 [GPa].

In the inkjet head above, preferably, the piezoelectric layer includes a perovskite-type compound.

In the inkjet head above, preferably, the perovskite-type compound includes a lead zirconate titanate-based compound and includes donor ions and acceptor ions.

In the inkjet head above, preferably, the diaphragm is formed of a material including Si.

In the inkjet head above, preferably, the donor ions include one or more kinds of ions selected from the group consisting of La, Nb, Ta, and W. The acceptor ions include one or more kinds of ions selected from the group consisting of Fe, Co, and Mn. The difference in mol % ratio between the donor ions and the acceptor ions is 1 mol % or less.

In the inkjet head above, the perovskite-type compound includes a potassium sodium niobite-based compound.

In the inkjet head above, the perovskite-type compound includes a sodium bismuth titanate-based compound.

In the inkjet head above, preferably, a seed layer is provided between the piezoelectric layer and the diaphragm.

In the inkjet head above, the inkjet ink in the inkjet head has a viscosity of 10 [cp] or more.

An inkjet recording apparatus according to the present invention includes the inkjet head as described above.

The present invention provides a method of manufacturing an inkjet head including a piezoelectric layer formed of a thin film and a diaphragm to eject inkjet ink. The absolute value of the product of the piezoelectric constant $d_{31}$ of the piezoelectric layer and the Young's modulus of the piezoelectric layer is 10 $[C/m^2]$ to 15 $[C/m^2]$. The method of manufacturing an inkjet head includes a step of depositing the piezoelectric layer by sputtering.

Advantageous Effects of Invention

In the configurations above, even when the inkjet head ejects ink having a high viscosity, such as 10 [cp] or more, variation of driving voltage during ink ejection can be suppressed, and stable high output characteristics can be achieved. Sputtering is preferred in terms of facilitating stable deposition even when two or more kinds of element ions are included.

DETAILED DESCRIPTION OF EMBODIMENTS

Embodiments according to the present invention will be described below with reference to the drawings. In the following description, the same parts and the same components are denoted with the same reference signs. Their names and functions are the same, and a detailed description thereof may not be repeated. The embodiments or modifications described below may be selectively combined as appropriate.

(Inkjet Recording Apparatus 1)

Figure 1:
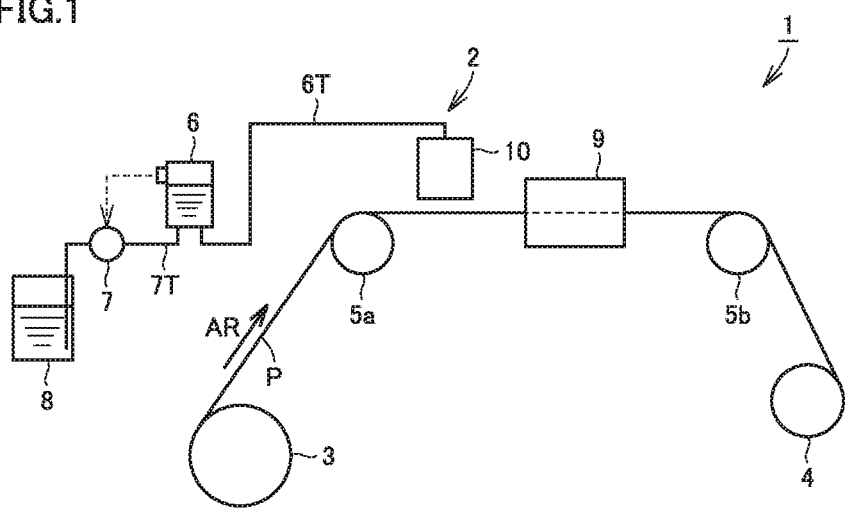
FIG. 1 is a diagram schematically showing an inkjet recording apparatus in an embodiment.

FIG. 1 is a diagram schematically showing an inkjet recording apparatus 1. As shown in FIG. 1, inkjet recording apparatus 1 includes an inkjet head unit 2, a feed roll 3, a take-up roll 4, back rolls 5a, 5b, an intermediate tank 6, a feeding pump 7, a storage tank 8, a fixing device 9, an inkjet head 10, and pipe lines 6T, 7T.

Feed roll 3 feeds a recording medium P in a direction shown by arrow AR. Recording medium P refers to, for example, print paper or cloth. Take-up roll 4 takes up recording medium P fed from feed roll 3 and having an image formed thereon in inkjet head unit 2. Back rolls 5a, 5b are provided between feed roll 3 and take-up roll 4.

Ink stored in storage tank 8 is supplied to intermediate tank 6 through feeding pump 7 and pipe line 7T. Ink stored in intermediate tank 6 is supplied from intermediate tank 6 to inkjet head 10 through pipe line 6T. Inkjet head 10 ejects ink (inkjet ink) onto recording medium P in inkjet head unit 2. Fixing device 9 fixes ink supplied to recording medium P, on recording medium P. Inkjet recording apparatus 1 thus can form an image on recording medium P.

Figure 2:
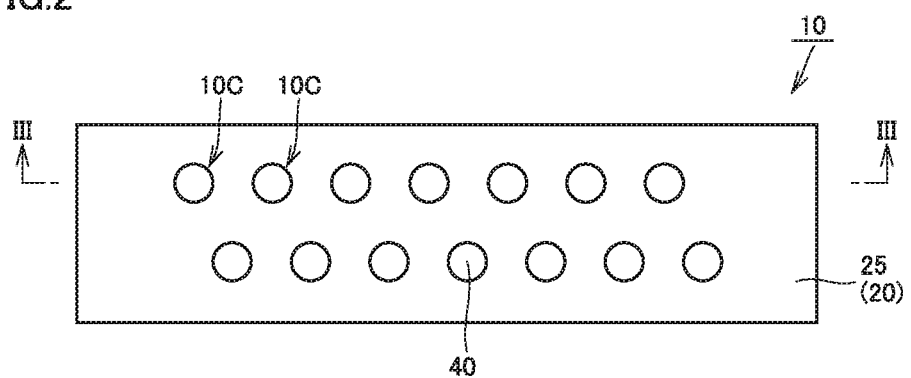
FIG. 2 is a top view of an inkjet head included in the inkjet recording apparatus in the embodiment.
Figure 3:
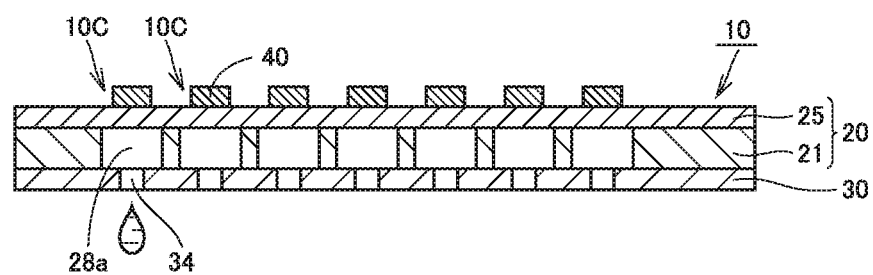
FIG. 3 is a cross-sectional view taken along line III-III in FIG. 2.
Figure 4:
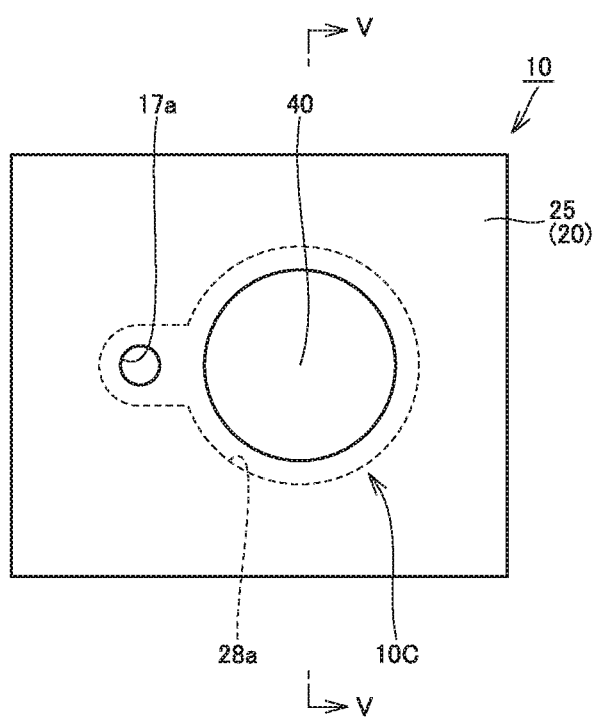
FIG. 4 is a plan view showing a channel formed in the inkjet head included in the inkjet recording apparatus in the embodiment.
Figure 5:
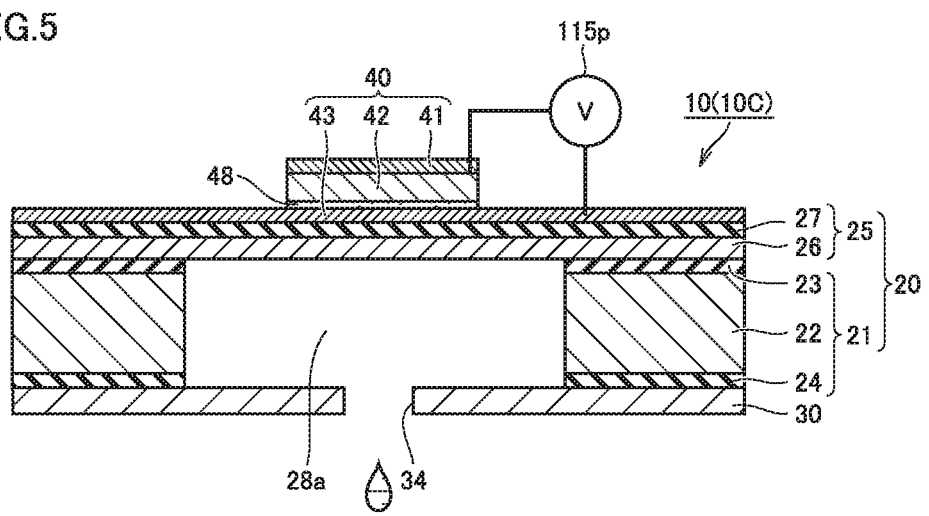
FIG. 5 is a cross-sectional view taken along line V-V in FIG. 4.
Figure 6:
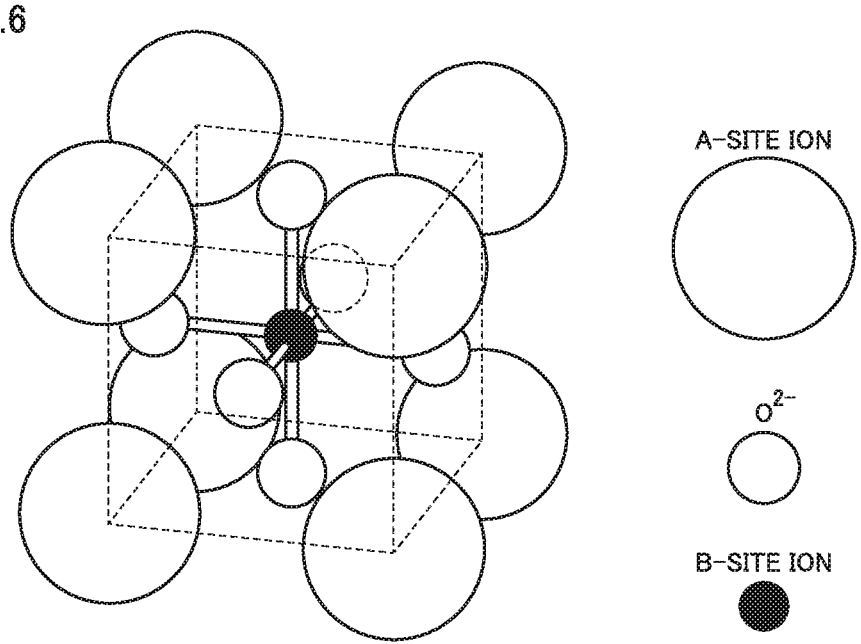
FIG. 6 is a diagram schematically showing the crystal structure of a perovskite-type compound.

(Inkjet Head 10) FIG. 2 is a top view of inkjet head 10. FIG. 3 is a cross-sectional view taken along line in FIG. 2. FIG. 4 is a plan view showing a channel 10C formed in inkjet head 10. FIG. 5 is a cross-sectional view taken along line V-V in FIG. 4. FIG. 6 is a diagram schematically showing the crystal structure of a perovskite-type compound.

As shown in FIG. 2 and FIG. 3, inkjet head 10 includes a substrate 20, a nozzle plate (FIG. 3) 30, and a plurality of thin-film piezoelectric elements 40. Substrate 20 is a member serving as a base for forming a pressure chamber 28a (FIG. 3 to FIG. 5) in the inside, layering thin-film piezoelectric elements 40, and joining nozzle plate 30, and includes a body 21 (FIG. 3) and a diaphragm 25.

Referring to FIG. 4 and FIG. 5 (particularly referring to FIG. 5), body 21 of substrate 20 includes a body substrate 22 and insulating films 23, 24. Body substrate 22 is formed of, for example, silicon (Si). Insulating films 23, 24 are formed of, for example, silicon oxide ($SiO_2$).

Insulating film 23 is formed on one surface of body substrate 22, and insulating film 24 is formed on the other surface of body substrate 22.

Diaphragm 25 of substrate 20 partially vibrates with expansion and contraction of thin-film piezoelectric element 40 provided corresponding to pressure chamber 28a. Diaphragm 25 has an ink supply port 17a (FIG. 4). Diaphragm 25 in the present embodiment includes a driven plate 26 and an insulating film 27. For example, driven plate 26 is formed of silicon (Si), and insulating film 27 is formed of silicon oxide ($SiO_2$). That is, diaphragm 25 in the present embodiment includes silicon (Si). The Young's modulus of diaphragm 25 is preferably 100 [GPa] to 500 [GPa]. Examples of the material used for the diaphragm include $Si_3N_4$ (Young's modulus of 250 to 350 [GPa]) and SiC (Young's modulus of 350 to 500 [GPa]) including Si, as well as $Al_2O_3$, Al (Young's modulus of about 360 [GPa]), and AlN (Young's modulus of about 300 [GPa]) including Al. The Young's modulus of the diaphragm may be determined, for example, by bending test, tensile test, or a resonance vibration method if it is a bulk material, or may be determined, for example, by a nanoindentation method or an ultrasonic method if it is a thin-film material.

Thin-film piezoelectric element 40 includes a piezoelectric layer 42 (FIG. 5) formed of a thin film and a pair of electrodes 41, 43 and is provided on substrate 20. Electrodes 41, 43 each are formed of a metal layer, for example, such as a titanium or platinum layer. As shown in FIG. 5, it is preferable that a seed layer 48 is provided between substrate 20 and piezoelectric layer 42 (more specifically, between electrode 43 and piezoelectric layer 42). Diaphragm 25 is positioned between pressure chamber 28a and thin-film piezoelectric element 40. In other words, thin-film piezoelectric element 40 is provided on diaphragm 25 on the opposite side to pressure chamber 28a.

Referring to FIG. 6, it is preferable that piezoelectric layer 42 included in thin-film piezoelectric element 40 includes a perovskite-type compound (metal oxide) as shown in FIG. 6, such as barium titanate ($BaTiO_3$) and lead zirconate titanate ($Pb(Ti/Zr)O_3$). Piezoelectric layer 42 included in thin-film piezoelectric element 40 is not limited to lead zirconate titanate and may include any other lead zirconate titanate-based compounds. Piezoelectric layer 42 included in thin-film piezoelectric element 40 may include donor ions and acceptor ions.

It is preferable that one or more kinds of ions selected from the group consisting of La, Nb, Ta, and W are included as the donor ions. It is preferable that one or more kinds of ions selected from the group consisting of Fe, Co, and Mn are included as the acceptor ions. The difference in mol % between the donor ions and the acceptor ions is preferably 1 mol % or less, more preferably 0.5 mol % or less, further preferably 0.2 mol % or less. The mol % of the donor ions and the acceptor ions can be measured by, for example, energy dispersive X-ray spectrometry (EDX). It is preferable that the difference in mol % between donor ions and acceptor ions is smaller, because if so, charges are balanced and, consequently, the piezoelectric constant can be improved without reducing the Young's modulus.

Piezoelectric layer 42 included in thin-film piezoelectric element 40 may include a potassium sodium niobite-based compound (($K, Na)NbO_3$ (which hereinafter may be referred to as KNN)). Piezoelectric layer 42 included in thin-film piezoelectric element 40 may include a sodium bismuth titanate-based compound ($Bi_{0.5}Na_{0.5})TiO_3$ (which hereinafter may be referred to as BNT)).

Examples of the process of depositing a thin-film piezoelectric layer, such as PZT, on a substrate of Si or the like include chemical processes such as CVD, physical processes such as sputtering and ion plating, and liquid-phase deposition processes such as sol-gel process. The upper limit of the film thickness of the thin film obtained by these processes is about 10 μm, and if the film thickness is equal to or greater than this upper limit, cracks or film separation tends to occur. Thus, the film thickness upper limit of the thin film is preferably less than 10 μm. The deposited thin-film piezoelectric thin layer, such as PZT, exhibits favorable piezoelectric effects when the crystals are crystals of a perovskite-type compound (FIG. 6).

Nozzle plate 30 is affixed to substrate 20 on the side opposite to the side on which thin-film piezoelectric element 40 (FIG. 2) is provided. Nozzle plate 30 has a nozzle hole 34. Thin-film piezoelectric element 40, diaphragm 25, pressure chamber 28a, and nozzle hole 34 form channel 10C.

Thin-film piezoelectric element 40 is formed at a position where diaphragm 25 is sandwiched between thin-film piezoelectric element 40 and pressure chamber 28a from above and below. Ink is supplied from a not-shown tank to pressure chamber 28a through ink supply port 17a. For example, ink having a viscosity of 15 [cp] or less can be used as the ink in pressure chamber 28a. Ink having a viscosity of 10 [cp] or more may be used. It is assumed that the viscosity of ink is usually the viscosity at room temperature (25° C.). However, it is known that the viscosity of ink has temperature dependency, and in some cases, the viscosity may be reduced in use by increasing the temperature of ink with a heating device provided in ink supply means or the ejection head. Therefore, in such a case, the viscosity of ink is the viscosity measured in the setting temperatures at which ink to be ejected is heated.

When voltage is applied to thin-film piezoelectric element 40 from a drive control unit 115p (FIG. 5), thin-film piezoelectric element 40 expands and contracts in a direction vertical to the thickness direction of thin-film piezoelectric element 40. Thin-film piezoelectric element 40 expands and contracts to partially vibrate diaphragm 25, causing bending deformation in diaphragm 25. Diaphragm 25 is thus displaced in the thickness direction. The up/down movement of diaphragm 25 changes the volume in pressure chamber 28a. Pressure is applied to ink in pressure chamber 28a, whereby ink is ejected from nozzle hole 34.

(Absolute Value of Product of Piezoelectric Constant $_{d31}$ of Piezoelectric Layer 42 and Young's Modulus of Piezoelectric Layer 42)

Here, the absolute value of the product of the piezoelectric constant $_{d31}$ of piezoelectric layer 42 and the Young's modulus of piezoelectric layer 42 is set to 10 [C/m$^2$] to 15 [C/m$^2$]. With the absolute value of the product within the range of 10 [C/m$^2$] to 15 [C/m$^2$], variation of the driving voltage can be suppressed even when ink having a high viscosity such as 10 [cp] or more is ejected. Thus, the ejection rate of ink can be stabilized, and a high-quality image can be formed.

This mechanism is as follows. For example, it is assumed that diaphragm 25 has a Young's modulus of about 100 [GPa] to 500 [GPa], diaphragm 25 is composed of a material such as silicon (Si), and the thickness of diaphragm 25 is set to a value approximately equal to the thickness of piezoelectric layer 42 formed of a thin film or a value approximately twice the thickness thereof. In this case, the Young's modulus of piezoelectric layer 42 is set approximately in a range of 50[GPa] to 120[GPa], so that the mechanical compliance Cm of the piezoelectric actuator falls approximately within a range of 10 [pL/MPa] to 20 [pL/MPa]. The mechanical compliance Cm of the piezoelectric actuator (thin-film piezoelectric element 40) is an index representing the easiness of deformation when pressure is applied to the piezoelectric actuator.

If the piezoelectric constant of piezoelectric layer 42 is a certain value or higher within a range in which the mechanical compliance Cm of the piezoelectric actuator is approximately 10 to 20 [pL/MPa], the pressure applied to the piezoelectric actuator (thin-film piezoelectric element 40) during voltage application has a value necessary and sufficient for ink ejection. That is, if the mechanical compliance Cm falls within the range above, even when a voltage equal to or higher than a predetermined value is applied to the piezoelectric actuator (thin-film piezoelectric element 40), a volume change that is greater than a value necessary and sufficient for ink ejection does not occur in pressure chamber 28a. Thus, variation of the driving voltage can be suppressed.

When the Young's modulus of the piezoelectric layer 42 is further greater, the compliance of the piezoelectric actuator becomes smaller than the value above. Thus, when a high pressure is applied, a sufficient pressure change fails to be produced in pressure chamber 28a. It is therefore desirable that the absolute value of the product of the piezoelectric constant $_{d31}$ of piezoelectric layer 42 and the Young's modulus of piezoelectric layer 42 is in the range of 10 [C/m$^2$] to 15 [C/m$^2$].

EXPERIMENTAL EXAMPLE

Figure 7:
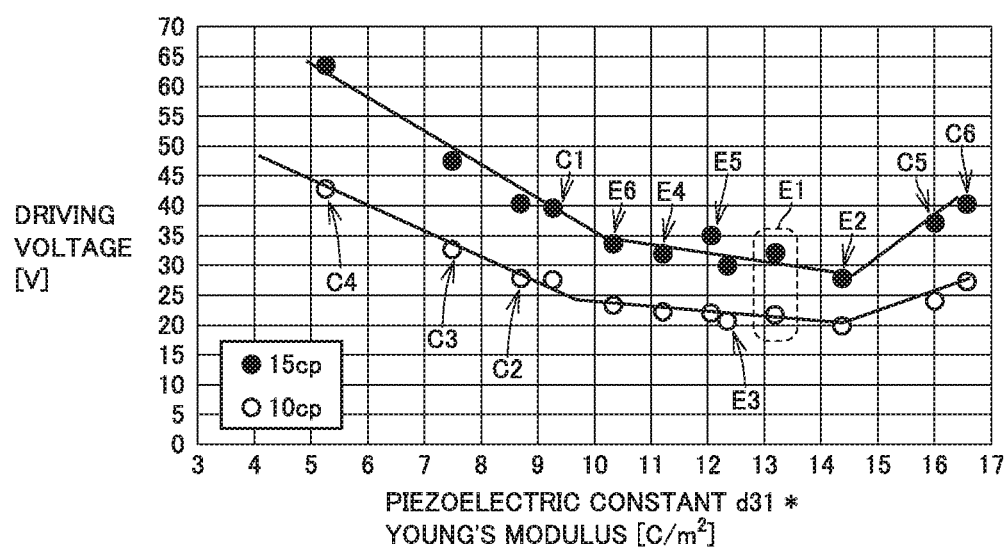
FIG. 7 is a graph showing the result of an experimental example based on the embodiment.

In the following, referring to FIG. 7 and FIG. 8 to FIG. 18, an experimental example will be described, which has been conducted on the technical meaning that the absolute value of the product of the piezoelectric constant $_{d31}$ of piezoelectric layer 42 and the Young's modulus of piezoelectric layer 42 is set to 10 [C/m$^2$] to 15 [C/m$^2$]. The experimental example includes Examples 1 to 6 and Comparative Examples 1 to 6, and FIG. 7 shows the result of the experimental example. In the following, referring to FIG. 8 to FIG. 18, the experiment conditions and the experiment results of Examples 1 to 6 and Comparative Examples 1 to 6 will be described in detail.

Example 1

Figure 8:
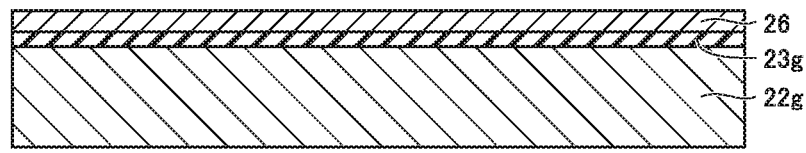
FIG. 8 is a cross-sectional view showing a first step of a method of manufacturing an inkjet head in Example 1 (and the embodiment).

Referring to FIG. 8, first of all, a wafer is prepared as a material of substrate 20 (FIG. 5). This wafer has an SOI (Silicon on insulator) structure in which two sheets of silicon are joined with a thermal oxide film 23g interposed therebetween. The wafer includes a section 22g (support layer) that undergoes post-processing to form body 21 (FIG. 5) and a section that undergoes post-processing to form driven plate 26. The thickness of the support layer is about 620 μm, and the thickness of the active layer is about 5 um.

Figure 9:
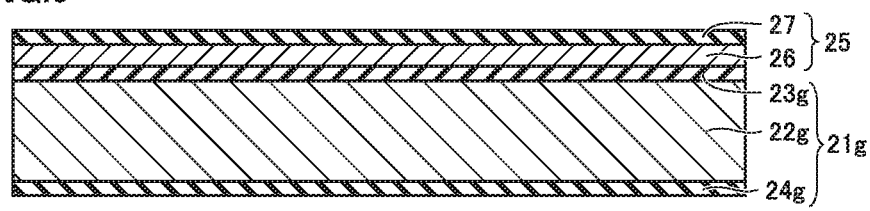
FIG. 9 is a cross-sectional view showing a second step of the method of manufacturing an inkjet head in Example 1 (and the embodiment).

Referring to FIG. 9, next, an insulating film 27 having a thickness of about 100 nm is formed on a surface of the wafer (driven plate 26). The thickness of the wafer is set to a standard value, such as 300 μm to 725 and the diameter is set to a standard value, such as 3 inches to 8 inches. Insulating film 27 can be formed by exposing the wafer to high temperatures of about 1200° C. in an oxygen atmosphere using a furnace for wet oxidation.

Figure 10:
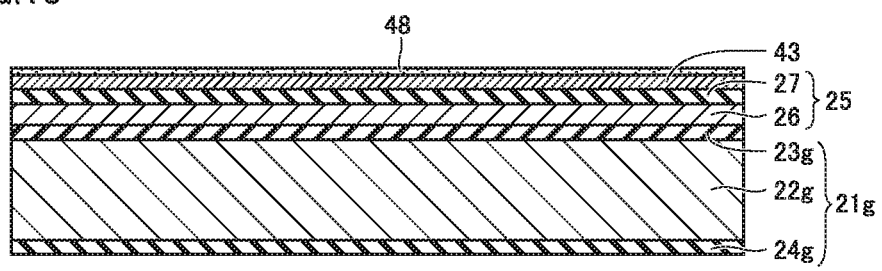
FIG. 10 is a cross-sectional view showing a third step of the method of manufacturing an inkjet head in Example 1 (and the embodiment).

Referring to FIG. 10, a metal layer formed of titanium (Ti), platinum (Pt), and the like (a section that undergoes post-processing to form electrode 43) is deposited by sputtering. Ti and Pt are deposited using a dual sputtering device having two targets Ti and Pt in a chamber. A layered structure of a Pt/Ti/Si substrate can be formed continuously without removing the substrate out of vacuum.

In Example 1, electrode 43 was formed by, first, forming titanium (Ti) having a thickness of about 10 nm as an intimate contact layer on a silicon substrate having an oxide film (insulating film 27) thereon and then forming platinum (Pt) having a thickness of about 150 nm. The sputtering conditions for Ti are as follows. The Ar flow rate was set to 20 sccm, the pressure was set to 0.5 Pa, the RF power applied to the target was set to 100 W, and the temperature of the substrate was set to 400° C. For Pt, the Ar flow rate was set to 20 sccm, the pressure was set to 0.5 Pa, the RF power applied to the target was 150 W, and the temperature of the substrate was set to 400° C.

In Example 1, seed layer 48 (see also FIG. 5) was subsequently formed on electrode 43. In order to form seed layer 48, PLT of about 20 nm was formed on Pt with a sputtering apparatus. The sputtering conditions are as follows. The Ar flow rate was set to 20 sccm, the O$_2$ flow rate was set to 0.3 sccm, the pressure was set to 0.5 Pa, the temperature of the substrate was set to 600° C., the RF power applied to the target was set to 500 W. A sputtering target with a La/Ti ratio of 10/100 was used. Seed layer 48 (see also FIG. 5) was thus formed on the surface of electrode 43.

Figure 11:
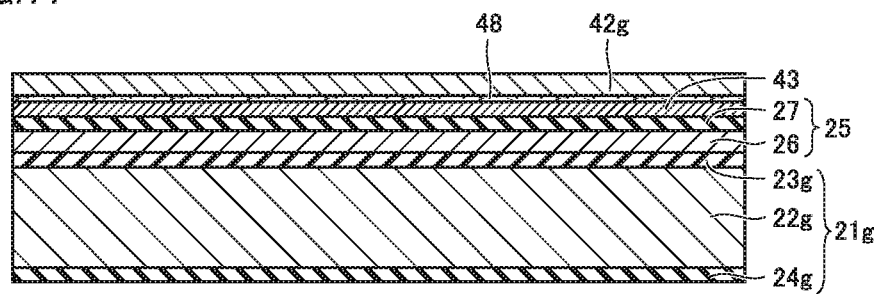
FIG. 11 is a cross-sectional view showing a fourth step of the method of manufacturing an inkjet head in Example 1 (and the embodiment).

Referring to FIG. 11, a piezoelectric thin film (PZT film) 42g containing La and Mn was subsequently formed on PLT using a sputtering apparatus. Piezoelectric thin film 42g is a member that undergoes post-processing to form piezoelectric layer 42 (see FIG. 5). The sputtering conditions are as follow. The Ar flow rate was set to 20 sccm, the $O_2$ flow rate was set to 0.6 sccm, the pressure was set to 0.5 Pa, the temperature of the substrate was set to 600° C., and the RF power applied to the target was set to 400 W. The deposition time was adjusted such that the film thickness of piezoelectric thin film 42g was about 5 um. A sputtering target with a Zr/Ti ratio of 54/46 was used with addition of 5 mol % of La and with addition of 5 mol % of Mn.

As for the Pb composition of PLT and PZT target, Pb easily evaporates at the time of deposition at high temperatures, and the formed thin film tends to be lacking in Pb. Therefore, Pb is added more than the stoichiometric ratio of crystals of the perovskite-type compound. Although the amount added depends on the deposition temperature, the amount of Pb in the target is preferably increased by 10 to 30 mol % compared with the stoichiometric ratio.

In Example 1, the film composition of the resultant piezoelectric thin film 42g (PZT film) was analyzed using an energy dispersive X-ray spectrometry (EDX). The Zr/Ti ratio was 54.1/45.9, the amount of La added to (Zr+Ti) was 5.1 mol %, and the amount of Mn added was 4.9 mol %. A film having a composition close to the target composition was obtained. The Pb excess ratio of the film was 1.05, which was a 5 mol % excess.

Figure 12:
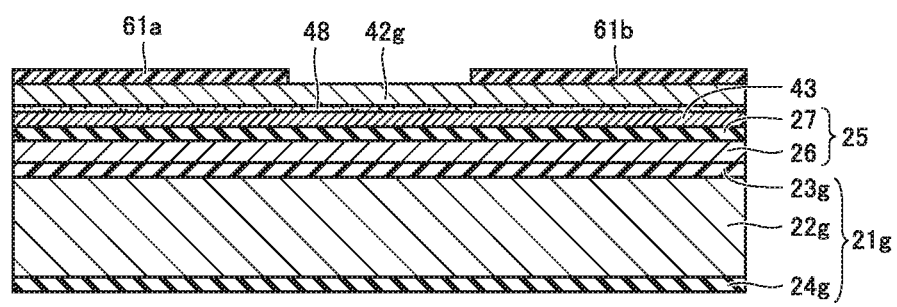
FIG. 12 is a cross-sectional view showing a fifth step of the method of manufacturing an inkjet head in Example 1 (and the embodiment).
Figure 13:
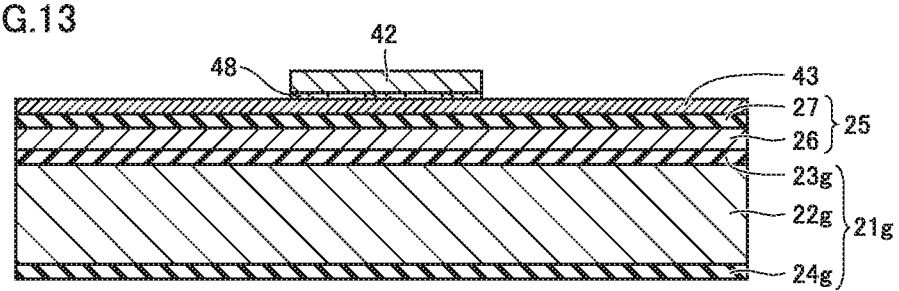
FIG. 13 is a cross-sectional view showing a sixth step of the method of manufacturing an inkjet head in Example 1 (and the embodiment).

Referring to FIG. 12, next, photosensitive resin materials 61a, 61b are applied on piezoelectric thin film 42g by spin coating. Referring to FIG. 13, exposure and etching (for example, reactive ion etching) are performed through a mask, so that an unnecessary portion of piezoelectric thin film 42g (FIG. 12) is removed, and piezoelectric layer 42 is developed.

Figure 14:
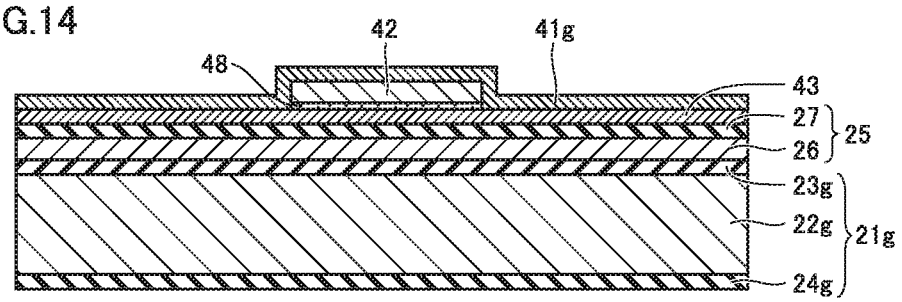
FIG. 14 is a cross-sectional view showing a seventh step of the method of manufacturing an inkjet head in Example 1 (and the embodiment).
Figure 15:
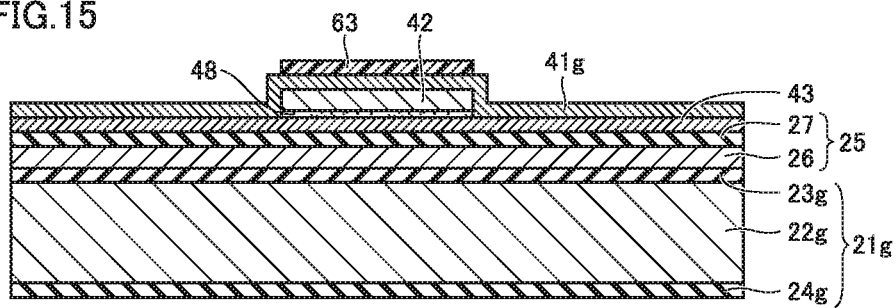
FIG. 15 is a cross-sectional view showing an eighth step of the method of manufacturing an inkjet head in Example 1.

Referring to FIG. 14, a metal layer 41g of titanium or platinum layer was deposited by sputtering so as to cover piezoelectric layer 42. Metal layer 41g is a member that undergoes post-processing to form electrode 41 (see FIG. 5). Referring to FIG. 15, a photosensitive resin material 63 is applied on metal layer 41g by spin coating.

Figure 16:
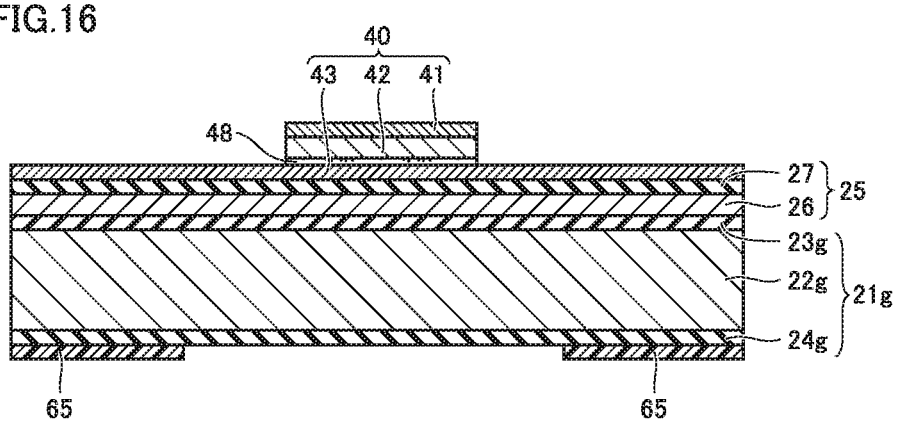
FIG. 16 is a cross-sectional view showing a ninth step of the method of manufacturing an inkjet head in Example 1 (and the embodiment).

Referring to FIG. 16, exposure and etching are performed through a mask, so that an unnecessary portion of metal layer 41g (FIG. 15) is removed. A thin-film piezoelectric element 40 including electrode 41, piezoelectric layer 42, and electrode 43 is thus formed. Next, a photosensitive resin material 65 is applied on a surface of an insulating film 24g by spin coating.

Figure 17:
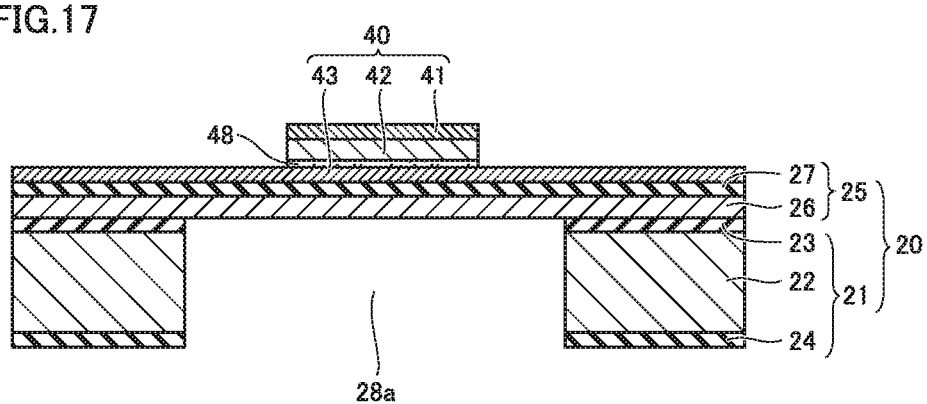
FIG. 17 is a cross-sectional view showing a tenth step of the method of manufacturing an inkjet head in Example 1 (and the embodiment).
Figure 18:
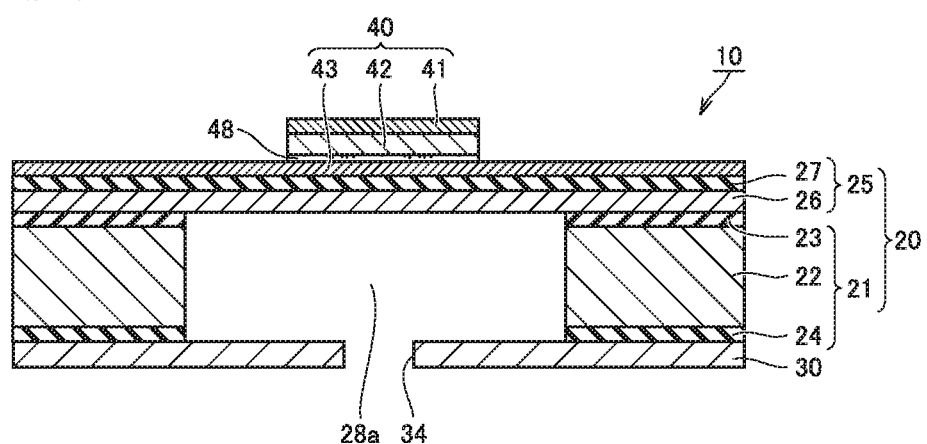
FIG. 18 is a cross-sectional view showing an eleventh step of the method of manufacturing an inkjet head in Example 1 (and the embodiment).

Referring to FIG. 17, exposure and etching are performed through a mask, so that an unnecessary portion of a body 21g (FIG. 16) is removed to form body 21. Referring to FIG. 18, after the unnecessary insulating film 24g and the like are removed, nozzle plate 30 is affixed to substrate 20. Pressure chamber 28a is thus formed to yield inkjet head 10.

For thin-film piezoelectric element 40 of the inkjet head fabricated based on Example 1, the Young's modulus of piezoelectric layer 42 and the piezoelectric constant of piezoelectric layer 42 were determined. The resonance frequency of the fabricated inkjet head was measured using an impedance analyzer (4294A manufactured by Agilent Technologies), and the Young's modulus of piezoelectric layer 42 was calculated from the obtained resonance frequency, the actuator size, and the Young's modulus 169 [$GPa(10^9*N/m^2)$] of Si, that is, diaphragm 25. In Example 1, the Young's modulus of piezoelectric layer 42 was 55 [$GPa(10^9*N/m^2)$].

The piezoelectric characteristics of piezoelectric layer 42 were obtained by calculation from the amount of displacement and the design shape of the actuator, using finite element method simulation software (ANSYS). The piezoelectric constant $d_{31}$ of piezoelectric layer 42 was −240 [$pm/V(10^{-12}*C/N)$]. Based on these results, the absolute value of the product of the piezoelectric constant and the Young's modulus of the piezoelectric thin film was calculated and found to be 13.2 [$C/m^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 21.7 [V]. Similarly, ink having a viscosity of 15 [cp] was used for evaluation, and the driving voltage at 7 [m/s] was 32.1 [V] (see the two results aligned vertically in FIG. 7, as surrounded by dotted line E1).

The steps illustrated as Example 1 can also be carried out as a method of manufacturing an inkjet head in the foregoing embodiment.

Example 2

The fabrication process is the same as in Example 1 (see FIG. 5) up to the step of forming seed layer 48 of PLT (see FIG. 10). Then, in the step corresponding to FIG. 11 in Example 1, a piezoelectric thin film of PZT containing Nb and Mn was deposited by sputtering on a substrate of PLT/Pt/Ti/Si. A sputtering target with a Zr/Ti ratio of 52/48 was used with addition of 10 mol % of Nb and with addition of 10 mol % of Mn. The sputtering conditions are as follows. The Ar flow rate was set to 20 sccm, the $O_2$ flow rate was set to 0.8 sccm, the pressure was set to 0.5 Pa, the temperature of the substrate was set to 550° C., and the RF power applied to the target was set to 400 W. The deposition time was adjusted such that the film thickness of the piezoelectric thin film was about 5 um.

The film composition of the resultant piezoelectric thin film (PZT film) was analyzed in the same manner as in Example 1. The Zr/Ti ratio was 51.9/48.1, the Nb content was 9.5 mol % and the Mn content was 10.2 mol % relative to (Zr+Ti), and the difference was 0.7 mol %. A film having a composition close to the target composition was obtained. The Pb excess ratio of the film was 1.09, which was a 9 mol % excess.

Subsequently, an inkjet head was fabricated using this film in the same manner as in Example 1, and the Young's modulus of the piezoelectric thin film and the piezoelectric constant of the piezoelectric thin film were determined. The Young's modulus of the piezoelectric thin film was 58 [$GPa(10^9*N/m^2)$], and the piezoelectric constant $d_{31}$ was −248 [$pm/V(10^{-12}*C/N)$]. Based on these results, the absolute value of the product of the piezoelectric constant and the Young's modulus of the piezoelectric thin film was calculated and found to be 14.4 [$C/m^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 19.8 [V]. Similarly, ink having a viscosity of 15 [cp] was used for evaluation, and the driving voltage at 7 [m/s] was 27.9 [V] (see the two results aligned vertically as indicated by the arrow E2 in FIG. 7).

Example 3

The fabrication process was the same as in Example 1 (see FIG. 5) up to the step of forming seed layer 48 of PLT (see FIG. 10). Then, in the step corresponding to FIG. 11 in Example 1, a piezoelectric thin film of PZT containing La and Fe was deposited by sputtering on a substrate of PLT/Pt/Ti/Si. A sputtering target with a Zr/Ti ratio of 52/48 was used with addition of 3 mol % of La and with addition of 3 mol % of Fe. The sputtering conditions are as follows. The Ar flow rate was set to 20 sccm, the $O_2$ flow rate was set to 1.0 sccm, the pressure was set to 0.5 Pa, the temperature of the substrate was set to 550° C., and the RF power applied to the target was set to 300 W. The deposition time was adjusted such that the film thickness of the piezoelectric thin film was about 4 um.

The film composition of the resultant piezoelectric thin film (PZT film) was analyzed in the same manner as in Example 1. The Zr/Ti ratio was 52.2/47.8, the La content was 2.8 mol % and the Fe content was 3.0 mol % relative to (Zr+Ti), and the difference was 0.2 mol %. A film having a composition close to the target composition was obtained. The Pb excess ratio of the film was 1.08, which was an 8 mol % excess.

Subsequently, an inkjet head was fabricated using this film in the same manner as in Example 1, and the Young's modulus of the piezoelectric thin film and the piezoelectric constant of the piezoelectric thin film were determined. The Young's modulus of the piezoelectric thin film was 64 [GPa($10^9$*N/m$^2$)], and the piezoelectric constant $d_{31}$ was −193 [pm/V($10^{-12}$*C/N)]. Based on these results, the absolute value of the product of the piezoelectric constant and the Young's modulus of the piezoelectric thin film was calculated and found to be 12.4 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 20.7 [V]. Similarly, ink having a viscosity of 15 [cp] was used for evaluation, and the driving voltage at 7 [m/s] was 29.9 [V] (see the two results aligned vertically, as indicated by arrow E3 in FIG. 7).

Example 4

The fabrication process was the same as in Example 1 up to the process of forming electrode 43 of Pt. Then, a piezoelectric thin film of PZT containing Ta and Co was deposited on a Pt/Ti/SOI substrate by sputtering, without providing a seed layer. A sputtering target with a Zr/Ti ratio of 52/48 was used with addition of 1 mol % of Ta and with addition of 1 mol % of Co. The sputtering conditions are as follows. The Ar flow rate was set to 20 sccm, the $O_2$ flow rate was set to 1.0 sccm, the pressure was set to 0.5 Pa, the temperature of the substrate was set to 520° C., and the RF power applied to the target was set to 300 W. The deposition time was adjusted such that the film thickness of the piezoelectric thin film was about 3 um.

The film composition of the resultant piezoelectric thin film (PZT film) was analyzed in the same manner as in Example 1. The Zr/Ti ratio was 51.5/42.5, the Ta content was 1.1 mol % and the Co content was 0.9 mol % relative to (Zr+Ti), and the difference was 0.2 mol %. A film having a composition close to the target composition was obtained. The Pb excess ratio of the film was 1.05, which was a 5 mol % excess.

Subsequently, an inkjet head was fabricated using this film in the same manner as in Example 1, and the Young's modulus of the piezoelectric thin film and the piezoelectric constant of the piezoelectric thin film were determined. The Young's modulus of the piezoelectric thin film was 70 [GPa($10^9$*N/m$^2$)], and the piezoelectric constant $d_{31}$ was −160 [pm/V($10^{-12}$*C/N)]. Based on these results, the absolute value of the product of the piezoelectric constant and the Young's modulus of the piezoelectric thin film was calculated and found to be 11.2 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 22.3 [V]. Similarly, ink having a viscosity of 15 [cp] was used for evaluation, and the driving voltage at 7 [m/s] was 32.2 [V] (see the two results aligned vertically, as indicated by arrow E4 in FIG. 7).

Example 5

The fabrication process was the same as in Example 1 (see FIG. 5) up to the step of forming seed layer 48 of PLT (see FIG. 10). Then, in the step corresponding to FIG. 11 in Example 1, a piezoelectric thin film (KNN film) of a material composition (K, Na)NbO$_3$ was deposited on a PLT/Pt/Ti/Si substrate by sputtering. A sputtering target with a K/Na ratio of 50/50 was used. The sputtering conditions are as follows. The Ar flow rate was set to 20 sccm, the $O_2$ flow rate was set to 1.0 sccm, the pressure was set to 0.5 Pa, the temperature of the substrate was set to 500° C., and the RF power applied to the target was set to 400 W. The deposition time was adjusted such that the film thickness of the piezoelectric thin film was about 3 um.

The film composition of the resultant piezoelectric thin film (KNN film) was analyzed in the same manner as in Example 1. The K/Na ratio was 50.3/49.7. A film having a composition close to the target composition was obtained.

Subsequently, an inkjet head was fabricated using this film in the same manner as in Example 1, and the Young's modulus and the piezoelectric constant of the piezoelectric thin film were determined. The Young's modulus of the piezoelectric thin film was 98 [GPa($10^9$*N/m$^2$)], and the piezoelectric constant $d_{31}$ was −123 [pm/V($10^{-12}$*C/N)]. Based on these results, the absolute value of the product of the piezoelectric constant and the Young's modulus of the piezoelectric thin film was calculated and found to be 12.1 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 22.0 [V]. Similarly, ink having a viscosity of 15 [cp] was used for evaluation, and the driving voltage at 7 [m/s] was 35.1 [V] (see the two results aligned vertically, as indicated by arrow E5 in FIG. 7).

Example 6

The fabrication process was the same as in Example 1 (see FIG. 5) up to the step of forming seed layer 48 of PLT (see FIG. 10). Then, in the step corresponding to FIG. 11 in Example 1, a piezoelectric thin film (BNT film) of a material composition (Bi, Na)TiO$_3$ was deposited on a substrate of PLT/Pt/Ti/Si by sputtering. A sputtering target with a Bi/Na ratio of 50/50 was used. The sputtering conditions are as follows. The Ar flow rate was set to 20 sccm, the $O_2$ flow rate was set to 1.0 sccm, the pressure was set to 0.5 Pa, the temperature of the substrate was set to 500° C., and the RF power applied to the target was set to 400 W. The deposition time was adjusted such that the film thickness of the piezoelectric thin film was about 3 um.

The film composition of the resultant piezoelectric thin film (KNN film) was analyzed in the same manner as in Example 1. The Bi/Na ratio was 48.5/51.5, and a film having a composition close to the target composition was obtained.

Subsequently, an inkjet head was fabricated using this film in the same manner as in Example 1, and the Young's modulus of the piezoelectric thin film and the piezoelectric constant of the piezoelectric thin film were determined. The Young's modulus of the piezoelectric thin film was 115 [GPa($10^9$*N/m$^2$)], and the piezoelectric constant $d_{31}$ was −90 [pm/V($10^{-12}$*C/N)]. Based on these results, the absolute value of the product of the piezoelectric constant and the Young's modulus of the piezoelectric thin film was calculated and found to be 10.3 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 23.3 [V]. Similarly, ink having a viscosity of 15 [cp] was used for evaluation, and the driving voltage at 7 [m/s] was 33.7 [V] (see the two results aligned vertically, as indicated by arrow E6 in FIG. 7).

Comparative Example 1

The fabrication process was the same as in Example 1 (see FIG. 5) up to the step of forming seed layer 48 of PLT (see FIG. 10). Then, in the step corresponding to FIG. 11 in Example 1, a PZT film containing La alone was deposited on a substrate of PLT/Pt/Ti/Si by sputtering. A sputtering target with a Zr/Ti ratio of 54/46 was used with addition of 5 mol % of La. The sputtering conditions are as follows. The Ar flow rate was set to 20 sccm, the $O_2$ flow rate was set to 0.6 sccm, the pressure was set to 0.5 Pa, the temperature of the substrate was set to 600° C., and the RF power applied to the target was set to 400 W. The deposition time was adjusted such that the film thickness of the piezoelectric thin film was about 5 um.

The film composition of the resultant piezoelectric thin film (PZT film) was analyzed in the same manner as in Example 1. The Zr/Ti ratio was 54.2/41.8, and the La content was 5.3 mol % relative to (Zr+Ti). A film having a composition close to the target composition was obtained. The Pb excess ratio of the film was 1.05, which was a 5 mol % excess.

Subsequently, an inkjet head was fabricated using this film in the same manner as in Example 1, and the Young's modulus of the piezoelectric thin film and the piezoelectric constant of the piezoelectric thin film were determined. The Young's modulus of the piezoelectric thin film was 40 [GPa($10^9$*N/m$^2$)], and the piezoelectric constant $d_{31}$ was −232 [pm/V($10^{-12}$*C/N)]. Based on these results, the absolute value of the product of the piezoelectric constant and the Young's modulus of the piezoelectric thin film was calculated and found to be 9.3 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 27.6 [V]. Similarly, ink having a viscosity of 15 [cp] was used for evaluation, and the driving voltage at 7 [m/s] was 39.6 [V] (see the two results aligned vertically, as indicated by arrow C1 in FIG. 7).

Comparative Example 2

The fabrication process was the same as in Example 1 (see FIG. 5) up to the step of forming seed layer 48 of PLT (see FIG. 10). Then, in the step corresponding to FIG. 11 in Example 1, a PZT film containing La alone was deposited on a substrate of PLT/Pt/Ti/Si by sputtering. A sputtering target with a Zr/Ti ratio of 52/48 was used with addition of 3 mol % of La. The sputtering conditions are as follows. The Ar flow rate was set to 20 sccm, the $O_2$ flow rate was set to 1.0 sccm, the pressure was set to 0.5 Pa, the temperature of the substrate was set to 550° C., and the RF power applied to the target was set to 300 W. The deposition time was adjusted such that the film thickness of the piezoelectric thin film was about 4 um.

The film composition of the resultant PZT film was analyzed in the same manner as in Example 1. The Zr/Ti ratio was 52.0/48.0, and the La content was 2.7 mol % relative to (Zr+Ti). A film having a composition close to the target composition was obtained. The Pb excess ratio of the film was 1.08, which was an 8 mol % excess.

Subsequently, an inkjet head was fabricated using this film in the same manner as in Example 1, and the Young's modulus and the piezoelectric constant of the piezoelectric thin film were obtained. The Young's modulus of the piezoelectric thin film was 46 [GPa($10^9$*N/m$^2$)], and the piezoelectric constant $d_{31}$ was −189 [pm/V($10^{-12}$*C/N)]. Based on these results, the absolute value of the product of the piezoelectric constant and the Young's modulus of the piezoelectric thin film was calculated and found to be 8.7 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 27.7 [V]. Similarly, ink having a viscosity of 15 [cp] was used for evaluation, and the driving voltage at 7 [m/s] was 40.5 [V] (see the two results aligned vertically, as indicated by arrow C2 in FIG. 7).

Comparative Example 3

The fabrication process was the same as in Example 1 (see FIG. 5) up to the step of forming seed layer 48 of PLT (see FIG. 10). Then, in the step corresponding to FIG. 11 in Example 1, a piezoelectric thin film containing Nb alone was deposited on a substrate of PLT/Pt/Ti/Si. A sputtering target with a Zr/Ti ratio of 52/48 was used with addition of 1 mol % of Nb. The sputtering conditions are as follows. The Ar flow rate was set to 20 sccm, the $O_2$ flow rate was set to 0.8 sccm, the pressure was set to 0.5 Pa, the temperature of the substrate was set to 550° C., and the RF power applied to the target was set to 400 W. The deposition time was adjusted such that the film thickness of the piezoelectric thin film was about 5 um.

The film composition of the resultant PZT film was analyzed in the same manner as in Example 1. The Zr/Ti ratio was 51.9/48.1, and the Nb content was 0.8 mol % relative to (Zr+Ti). A film having a composition close to the target composition was obtained. The Pb excess ratio of the film was 1.03, which was a 3 mol % excess.

Subsequently, an inkjet head was fabricated using this film in the same manner as in Example 1, and the Young's modulus and the piezoelectric constant of the piezoelectric thin film were determined. The Young's modulus of the piezoelectric thin film was 50 [GPa($10^9$*N/m$^2$)], and the piezoelectric constant $d_{31}$ was −150 [pm/V($10^{-12}$*C/N)]. Based on these results, the absolute value of the product of the piezoelectric constant and the Young's modulus of the piezoelectric thin film was calculated and found to be 7.5 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 32.7 [V]. Similarly, ink having a viscosity of 15 [cp] was used for evaluation, and the driving voltage at 7 [m/s] was 47.6 [V] (see the two results aligned vertically, as indicated by arrow C3 in FIG. 7).

Comparative Example 4

The fabrication process was the same as in Example 1 up to the step of forming electrode 43 of Pt. Then, a piezoelectric thin film (KNN film) of a material composition (K, Na)NbO$_3$ was deposited on a Pt/Ti/SOI substrate by sputtering without providing a seed layer. A sputtering target with a K/Na ratio of 50/50 was used. The sputtering conditions are as follows. The Ar flow rate was set to 20 sccm, the O$_2$ flow rate was set to 0.5 sccm, the pressure was set to 0.5 Pa, the temperature of the substrate was set to 500° C., and the RF power applied to the target was set to 400 W. The deposition time was adjusted such that the film thickness of the piezoelectric thin film was about 3 um.

The film composition of the resultant piezoelectric thin film (KNN film) was analyzed in the same manner as in Example 1. The K/Na ratio was 47.5/52.5, and a film having a composition close to the target composition was obtained.

Subsequently, an inkjet head was fabricated using this film in the same manner as in Example 1, and the Young's modulus and the piezoelectric constant of the piezoelectric thin film were determined. The Young's modulus of the piezoelectric thin film was 51 [GPa($10^9$*N/m$^2$)], and the piezoelectric constant $d_{31}$ was −101 [pm/V($10^{-12}$*C/N)]. Based on these results, the absolute value of the product of the piezoelectric constant and the Young's modulus of the piezoelectric thin film was calculated and found to be 5.3 [C/m$^2$].

Subsequently, ink having a viscosity of 10 [cp] was introduced into the fabricated inkjet head, and the ink ejection characteristics were evaluated. The driving voltage at which the ejection rate of ink droplets was 7 [m/s] was 42.9 [V]. Similarly, ink having a viscosity of 15 [cp] was used for evaluation, and the driving voltage at 7 [m/s] was 63.5 [V] (see the two results aligned vertically, as indicated by arrow C4 in FIG. 7).

Comparative Example 5

The fabrication process was the same as in Example 1 (see FIG. 5) up to the step of forming seed layer 48 of PLT (see FIG. 10). Then, in the step corresponding to FIG. 11 in Example 1, a PZT film containing Mn alone was deposited on a substrate of PLT/Pt/Ti/Si by sputtering. A sputtering target with a Zr/Ti ratio of 50/50 was used with addition of 3 mol % of Mn. The sputtering conditions are as follows. The Ar flow rate was set to 20 sccm, the O$_2$ flow rate was set to 0.5 sccm, the pressure was set to 0.7 Pa, the temperature of the substrate was set to 600° C., and the RF power applied to the target was set to 400 W. The deposition time was adjusted such that the film thickness of the piezoelectric thin film was about 5 um.

The film composition of the resultant piezoelectric thin film (PZT film) was analyzed in the same manner as in Example 1. The Zr/Ti ratio was 50.1/49.9, and the Mn content was 3.1 mol % relative to (Zr+Ti). A film having a composition close to the target composition was obtained. The Pb excess ratio of the film was 1.02, which was a 2 mol % excess.

Subsequently, an inkjet head was fabricated using this film in the same manner as in Example 1, and the Young's modulus and the piezoelectric constant of the piezoelectric thin film were determined. The Young's modulus of the piezoelectric thin film was 125 [GPa(GPa($10^9$*N/m$^2$)], and the piezoelectric constant $d_{31}$ was −128 [pm/V($10^{-12}$*C/N)]. Based on these results, the absolute value of the product of the piezoelectric constant and the Young's modulus of the piezoelectric thin film was calculated and found to be 16.0 [C/m$^2$].

Subsequently, ink having a viscosity of 10 [cp] was introduced into the fabricated inkjet head, and the ink emission characteristics were evaluated. The driving voltage at which the emission characteristics of ink droplets was 7 [m/s] was 24.1 [V]. Similarly, ink having a viscosity of 15 [cp] was used for evaluation, and the driving voltage at 7 [m/s] was 37.2 [V] (see the two results aligned vertically, as indicated by arrow C5 in FIG. 7).

Comparative Example 6

The fabrication process was the same as in Example 1 (see FIG. 5) up to the step of forming seed layer 48 of PLT (see FIG. 10). Then, in the step corresponding to FIG. 11 in Example 1, a PZT film containing Fe alone was deposited on a substrate of PLT/Pt/Ti/Si by sputtering. A sputtering target with a Zr/Ti ratio of 52/48 was used with addition of 5 mol % of Fe. The sputtering conditions are as follows. The Ar flow rate was set to 20 sccm, the O$_2$ flow rate was set to 0.5 sccm, the pressure was set to 0.7 Pa, the pressure was set to 0.7 Pa, the temperature of the substrate was set to 600° C., and the RF power applied to the target was set to 400 W. The deposition time was adjusted such that the film thickness of the piezoelectric thin film was about 5 um.

The film composition of the resultant PZT film was analyzed in the same manner as in Example 1. The Zr/Ti ratio was 52.2/47.8, and the Fe content was 4.8 mol % relative to (Zr+Ti). A film having a composition close to the target composition was obtained. The Pb excess ratio of the film was 1.01, which was a 1 mol % excess.

Subsequently, an inkjet head was fabricated using this film in the same manner as in Example 1, and the Young's modulus and the piezoelectric constant of the piezoelectric thin film were determined. The Young's modulus of the piezoelectric thin film was 137 [GPa($10^9$*N/m$^2$)], and the piezoelectric constant $d_{31}$ was −121 [pm/V($10^{-12}$*C/N)]. Based on these results, the absolute value of the product of the piezoelectric constant and the Young's modulus of the piezoelectric thin film was calculated and found to be 16.6 [C/m$^2$].

Subsequently, ink having a viscosity of 10 [cp] was introduced into the fabricated inkjet head, and the ink emission characteristics were evaluated. The driving voltage at which the emission rate of ink droplets was 7 [m/s] was 27.3 [V]. Similarly, ink having a viscosity of 15 [cp] was used for evaluation, and the driving voltage at 7 [m/s] was 40.1 [V] (see the two results aligned vertically, as indicated by arrow C6 in FIG. 7).

SUMMARY

The results above can be summed up in the graph shown in FIG. 7. As is clear from the graph, in a region in which the product of the piezoelectric constant and the Young's modulus is 10 [C/m$^2$] to 15 [C/m$^2$], the slope (change rate) of the graph is smaller than in the other regions. Therefore, when ink having a viscosity such as 10 [cp] or 15 [cp] is used, variation in film quality, if any, is less likely to cause variation of driving voltage. It is understood that an inkjet head having ejection characteristics of small variation of the driving voltage can be obtained.

The Young's modulus of diaphragm 25 is preferably 100 [GPa] or more in view of efficient transmission of energy of the diaphragm to ink having a high viscosity and is preferably 500 [GPa] or less in view of deformation of the diaphragm. That is, although the driving voltage during ink ejection by the diaphragm is likely to vary, high output characteristics can be obtained. In the examples of the present invention, the Young's modulus of the diaphragm was measured by the resonance vibration method. When the piezoelectric layer includes donor ions and acceptor ions, the film quality is likely to vary, and consequently, the driving voltage is likely to vary. In this respect, in the foregoing embodiment, the absolute value of the product of the piezoelectric constant $d_{31}$ of the piezoelectric layer and the Young's modulus of the piezoelectric layer is set to 10 [C/m$^2$] to 15 [C/m$^2$] so that variation of driving voltage can be suppressed.

Other Examples

Although the piezoelectric thin film is formed by sputtering in the foregoing examples, the deposition process is not limited thereto, and any other physical deposition processes, such as pulse laser deposition (PLD) and ion plating, and chemical deposition processes, such as sol-gel process and MOCVD, may be used as long as a film having the configuration of the present invention can be formed.

The piezoelectric thin film is not limited to a single layer and may be a layered structure including two or more layers with an electrode interposed therebetween. In this case, the multilayer piezoelectric thin film may be of the same material or may be of different materials (for example, alternate layers of PTO and PZO). In the case of different materials, the product of the Young's modulus and the piezoelectric constant synthesized of the piezoelectric layers as a whole falls within a range of 10 [C/m$^2$] to 15 [C/m$^2$].

The electrode is not limited to Pt, and metals such as Au, Ir, IrO$_2$, RuO$_2$, LaNiO$_3$, and SrRuO$_3$ or metal oxides thereof, and a combination thereof may be employed. The seed layer between the lower electrode and the piezoelectric layer is not limited to PLT and, for example, a perovskite-type compound, such as STO, SRO, LNO, and PT may be used.

The embodiment disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST

1 inkjet recording apparatus, 2 inkjet head unit, 3 feed roll, 4 take-up roll, 5*a*, 5*b* back roll, 6 intermediate tank, 6T, 7T pipe line, 7 feeding pump, 8 storage tank, 9 fixing device, 10 inkjet head, 10C channel, 17*a* ink supply port, 20 substrate, 21, 21*g* body, 22 body substrate, 22*g* section, 23, 24, 24*g*, 27 insulating film, 23*g* thermal oxide film, 25 diaphragm, 26 driven plate, 28*a* pressure chamber, 30 nozzle plate, 34 nozzle hole, 40 thin-film piezoelectric element, 41 electrode (upper electrode), 41*g* metal layer, 42 piezoelectric layer, 42*g* piezoelectric thin film, 43 electrode (lower electrode), 48 seed layer, 61*a*, 61*b*, 63, 65 resin material, 115*p* drive control unit, P recording medium.

The invention claimed is:

1. An inkjet head configured to eject inkjet ink,
said inkjet head comprising a piezoelectric layer formed of a thin film and a diaphragm,
wherein an absolute value of a product of a piezoelectric constant $d_{31}$ of said piezoelectric layer and a Young's modulus of said piezoelectric layer is 10 [C/m$^2$] to 15 [C/m$^2$];
wherein said piezoelectric layer includes a perovskite-type compound; and
wherein said perovskite-type compound includes a potassium sodium niobite-based compound.

2. The inkjet head according to claim 1, wherein said inkjet ink in said inkjet head has a viscosity of 15 [cp] or less.

3. The inkjet head according to claim 1, wherein said diaphragm has a Young's modulus of 100 [GPa] to 500 [GPa].

4. The inkjet head according to claim 1, wherein said perovskite-type compound includes a lead zirconate titanate-based compound and includes donor ions and acceptor ions.

5. The inkjet head according to claim 4, wherein
said donor ions include one or more kinds of ions selected from the group consisting of La, Nb, Ta, and W,
said acceptor ions include one or more kinds of ions selected from the group consisting of Fe, Co, and Mn, and
a difference in mol % ratio between said donor ions and said acceptor ions is 1 mol % or less.

6. The inkjet head according to claim 1, wherein said diaphragm is formed of a material including Si.

7. The inkjet head according to claim 1, wherein said perovskite-type compound includes a sodium bismuth titanate-based compound.

8. The inkjet head according to claim 1, wherein a seed layer is provided between said piezoelectric layer and said diaphragm.

9. The inkjet head according to claim 1, wherein said inkjet ink in said inkjet head has a viscosity of 10 [cp] or more.

10. An inkjet recording apparatus comprising the inkjet head of claim 1.

11. An inkjet head configured to eject inkjet ink,
said inkjet head comprising a piezoelectric layer formed of a thin film and a diaphragm,
wherein an absolute value of a product of a piezoelectric constant $d_{31}$ of said piezoelectric layer and a Young's modulus of said piezoelectric layer is 10 [C/m$^2$] to 15 [C/m$^2$];
wherein said piezoelectric layer includes a perovskite-type compound;
wherein said perovskite-type compound includes a lead zirconate titanate-based compound and includes donor ions and acceptor ions;
said donor ions include one or more kinds of ions selected from the group consisting of La, Nb, Ta, and W;

said acceptor ions include one or more kinds of ions selected from the group consisting of Fe, Co, and Mn; and a difference in mol % ratio between said donor ions and said acceptor ions is 1 mol % or less.

* * * * *